(12) United States Patent
Nishiyama

(10) Patent No.: US 11,537,487 B2
(45) Date of Patent: Dec. 27, 2022

(54) INFORMATION PROCESSING APPARATUS AND CONTROL METHOD

(71) Applicant: FUJITSU LIMITED, Kawasaki (JP)

(72) Inventor: Ryuichi Nishiyama, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 480 days.

(21) Appl. No.: 16/691,684

(22) Filed: Nov. 22, 2019

(65) Prior Publication Data

US 2020/0201736 A1    Jun. 25, 2020

(30) Foreign Application Priority Data

Dec. 19, 2018  (JP) .............................. JP2018-237367

(51) Int. Cl.
| | | |
|---|---|---|
| *G06F 11/30* | (2006.01) | |
| *G01R 31/317* | (2006.01) | |
| *G06F 1/04* | (2006.01) | |
| *G06F 11/36* | (2006.01) | |

(52) U.S. Cl.
CPC .... *G06F 11/3058* (2013.01); *G01R 31/31703* (2013.01); *G01R 31/31725* (2013.01); *G01R 31/31727* (2013.01); *G06F 1/04* (2013.01)

(58) Field of Classification Search
None
See application file for complete search history.

(56) References Cited

U.S. PATENT DOCUMENTS

| | | | | |
|---|---|---|---|---|
| 5,161,229 A | * | 11/1992 | Yasui ................... | G06F 9/3861 |
| | | | | 712/E9.06 |
| 5,761,517 A | | 6/1998 | Durham et al. | |
| 8,487,795 B1 | * | 7/2013 | Jiang ................... | G11C 27/024 |
| | | | | 327/434 |
| 2003/0160645 A1 | * | 8/2003 | Eto ........................ | G11C 7/109 |
| | | | | 327/276 |

(Continued)

FOREIGN PATENT DOCUMENTS

| | | |
|---|---|---|
| JP | 10-91269 A | 4/1998 |
| JP | 2006-119777 A | 5/2006 |

(Continued)

OTHER PUBLICATIONS

Japanese Office Action dated Aug. 2, 2022 for corresponding Japanese Patent Application No. 2018-237367, with English Translation, 6 pages.

*Primary Examiner* — Cynthia Britt
*Assistant Examiner* — Dipakkumar B Gandhi
(74) *Attorney, Agent, or Firm* — Fujitsu Patent Center

(57) ABSTRACT

In an information processing apparatus, a control unit receives operation instructions. Each time receiving an operation instruction, the control unit detects the number of operating circuits that are to operate in accordance with the received operation instruction, in a circuit group of circuits that operate in synchronization with a clock signal. In addition, each time receiving an operation instruction, the control unit determines whether power supply noise that is likely to cause a timing error in the circuit group will occur, (Continued)

on the basis of a result of comparing an increase in the number of operating circuits per prescribed time period with a threshold, and lowers the frequency of the clock signal when determining that the power supply noise will occur.

6 Claims, 16 Drawing Sheets

(56) References Cited

U.S. PATENT DOCUMENTS

| | | | | |
|---|---|---|---|---|
| 2005/0021728 | A1* | 1/2005 | Sugimoto | G06F 3/1204 709/223 |
| 2005/0127951 | A1* | 6/2005 | Patella | H03K 19/0963 326/95 |
| 2009/0147610 | A1* | 6/2009 | Shikata | G11C 5/143 365/226 |
| 2013/0307504 | A1* | 11/2013 | Sato | G11C 5/148 323/282 |
| 2014/0376326 | A1* | 12/2014 | Lee | G11C 8/18 365/233.14 |
| 2016/0179110 | A1 | 6/2016 | Rotem et al. | |
| 2016/0380641 | A1 | 12/2016 | Hashimoto | |
| 2017/0075404 | A1 | 3/2017 | Kitaji et al. | |
| 2017/0257402 | A1* | 9/2017 | Umehara | H04L 67/141 |
| 2017/0329631 | A1* | 11/2017 | Yin | G06F 9/4843 |
| 2018/0175838 | A1 | 6/2018 | Hashimoto | |

FOREIGN PATENT DOCUMENTS

| | | |
|---|---|---|
| JP | 2011-138217 A | 7/2011 |
| JP | 2017-17671 A | 1/2017 |
| JP | 2017-58911 A | 3/2017 |
| JP | 2018-505470 A | 2/2018 |
| JP | 2018-101222 A | 6/2018 |

* cited by examiner

INFORMATION PROCESSING APPARATUS AND CONTROL METHOD

CROSS-REFERENCE TO RELATED APPLICATION

This application is based upon and claims the benefit of priority of the prior Japanese Patent Application No. 2018-237367, filed on Dec. 19, 2018, the entire contents of which are incorporated herein by reference.

FIELD

The embodiments discussed herein relate to an information processing apparatus and a control method.

BACKGROUND

In semiconductor integrated circuits, such as large scale integrated (LSI) circuits, power supply noise (also called simultaneous switching noise) may occur when computational load or an increase in the number of operating circuits per prescribed time period greatly changes. Here, the following possibility exists: If power supply noise occurs, the power supply voltage drops and therefore sufficient voltage is not supplied to internal circuits of the semiconductor integrated circuit, which generates a circuit delay and thus causes a timing error.

To prevent the occurrence of timing errors due to power supply noise, an adaptive clocking control (ACC) circuit has been used (see, for example, Japanese Laid-open Patent Publication No. 2017-17671). The ACC circuit monitors a drop in power supply voltage using a power supply noise monitor, and when the power supply voltage drops below a threshold voltage that causes a timing error, lowers the frequency of a clock signal to be supplied to internal circuits of the semiconductor integrated circuit, thereby preventing the timing error. Without the ACC circuit, there is a need to determine a clock frequency taking into account timing errors that are caused by the maximum power supply noise within the semiconductor integrated circuit. However, the use of the ACC circuit eliminates the need of such determination. As power supply noise monitors for conventional ACC circuits, there are a voltage sensor that directly detects a drop in power supply voltage, a delay measurement circuit that measures a signal delay due to a drop in power supply voltage, and others.

In this connection, in order to reduce impact of instantaneous power on power supply and battery, there has been used a technique of predicting, before the state of a semiconductor integrated circuit transitions to a new state, power in the new state and controlling a clock frequency on the basis of the predicted power (see, for example, Japanese National Publication of International Patent Application No. 2018-505470). In addition, there has been used a technique of stopping a clock when a voltage drop that causes a system malfunction is detected based on a result of monitoring power supply voltage at a sampling rate higher than an expected frequency of power supply voltage fluctuations (for example, Japanese Laid-open Patent Publication No. 2017-58911).

As described above, conventional ACC circuits employ a method of directly detecting a power supply voltage and a method of measuring a signal delay due to a drop in power supply voltage. Therefore, owing to the time for propagation of power supply noise to an ACC circuit and the delay time due to a detection delay of a power supply noise monitor and others, a clock frequency is lowered only after the power supply noise substantially Occurs. That is, it is difficult to handle sudden (instantaneous) power supply noise. To deal with this, the conventional ACC circuits may be designed to set a relatively high threshold so as to start to lower the clock frequency early enough, taking the above delay time into account.

In this case, however, the clock frequency may be lowered even when relatively small power supply noise that is unlikely to cause a timing error occurs (for example, such noise occurs during execution of a program with low computational load). Thus, there is a possibility of increasing the number of times the clock frequency is lowered.

SUMMARY

According to one aspect, there is provided a non-transitory computer-readable recording medium storing a computer program that causes a computer to perform a process including: receiving operation instructions; detecting, each time receiving one of the operation instructions, a number of operating circuits that are to operate in accordance with the received operation instruction, in a circuit group of circuits that operate in synchronization with a clock signal; determining, each time receiving the one of the operation instructions, whether power supply noise that is likely to cause a timing error in the circuit group will occur, based on a result of comparing an increase in the number of operating circuits per prescribed time period with a threshold; and lowering a frequency of the clock signal upon determining that the power supply noise will occur.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, preferred embodiments will be described with reference to the accompanying drawings.

First Embodiment

Figure 1:
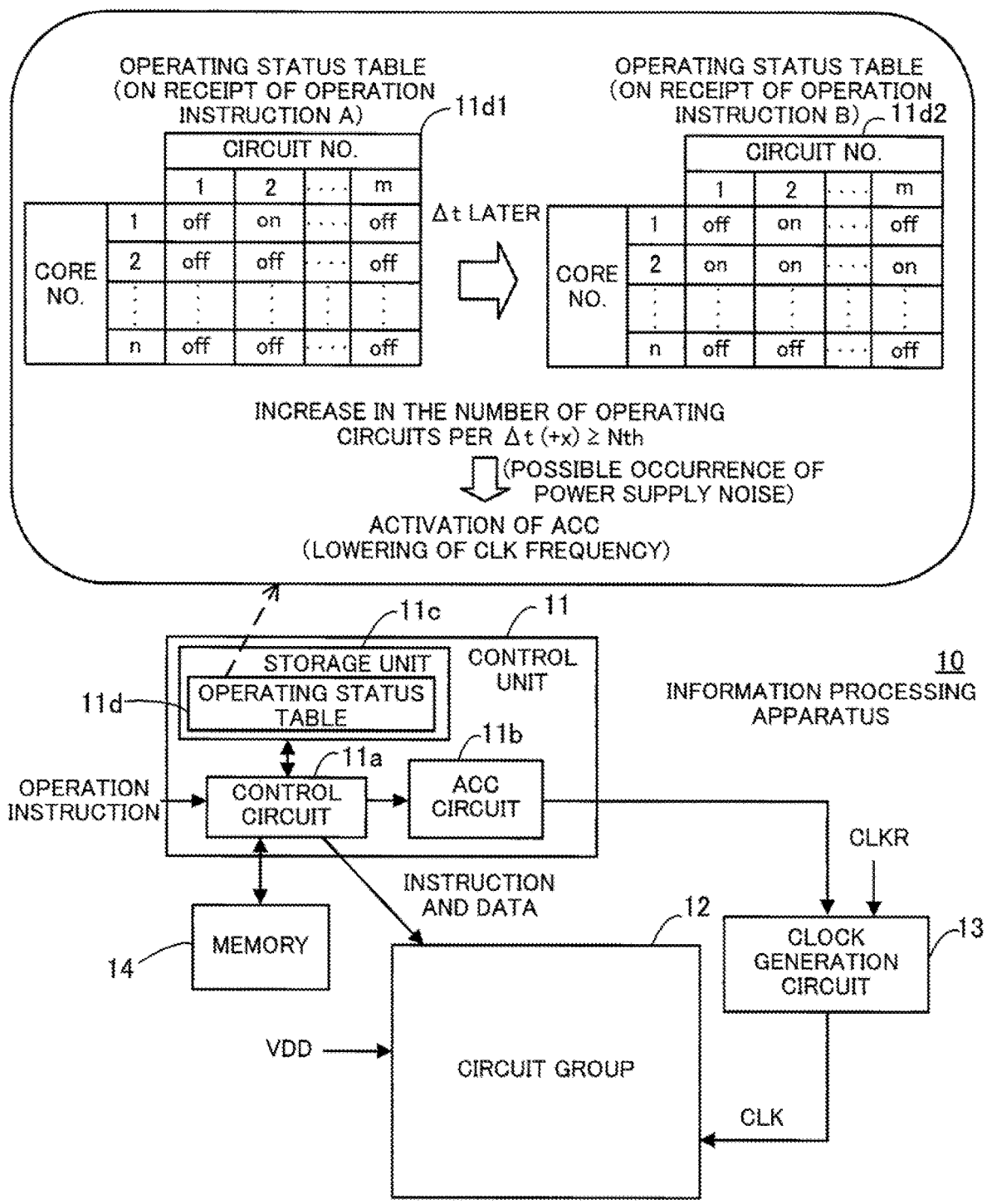
FIG. 1 illustrates an example of an information processing apparatus according to a first embodiment.

FIG. 1 illustrates an example of an information processing apparatus according to a first embodiment.

The information processing apparatus 10 is implemented by using a single-chip or multi-chip LSI, for example. The information processing apparatus 10 may be a single graphics processing unit (GPU) or another processor, for example.

The information processing apparatus 10 includes a control unit 11, a circuit group 12, a clock generation circuit 13, and a memory 14.

The control unit 11 receives an operation instruction via an input circuit, not illustrated, for example. Each time receiving an operation instruction, the control unit 11 detects the number of operating circuits that are to operate in accordance with the received operation instruction, in the circuit group 12 of circuits that operate in synchronization with a clock signal CLK. In addition, each time receiving an operation instruction, the control unit 11 determines whether power supply noise that is likely to cause a timing error in the circuit group 12 will occur, on the basis of a result of comparing an increase in the number of operating circuits per prescribed time period Δt with a threshold Nth. For example, if the increase (hereinafter, referred to as the increase +x) in the number of operating circuits per Δt is equal to or greater than the threshold Nth, the control unit 11 determines that power supply noise that is likely to cause a timing error will occur. When determining that power supply noise that is likely to cause a timing error will occur, the control unit 11 lowers the frequency of the clock signal CLK to be supplied to the circuit group 12.

For example, the threshold Nth is calculated (learned) in advance using a power supply noise monitor during shipping inspection or another occasion. For example, while the number of operating circuits that operate simultaneously is increased, the amount of power supply noise (hereinafter, referred to as noise amount, simply) is measured and compared with the amount of noise (acceptable value) that causes a timing error. Then, when the measured noise amount exceeds the acceptable value, the number of operating circuits at this time is set as the threshold Nth. In this connection, an example of the pre-learning process for the threshold Nth will be described later in a second embodiment.

The prescribed time period Δt is set, for example, during shipping inspection. For example, it is detected how much time it takes to increase the number of operating circuits by a prescribed value so that it causes power supply noise, and the prescribed time period Δt is set on the basis of the detected time period. For example, in the case where power supply noise occurs when four cycles of the clock signal CLK are taken to increase the number of operating circuits by the prescribed value, the prescribed time period Δt is set to the length of time equivalent to the four cycles of the clock signal CLK.

The control unit 11 includes a control circuit 11a, an ACC circuit 11b, and a storage unit 11c, for example.

Each time receiving an operation instruction, the control circuit 11a detects the number of operating circuits that are to operate in accordance with the received operation instruction, in the circuit group 12. For example, in the case where an operation instruction is to perform a multiplication operation, the control circuit 11a detects a multiplexer that is to execute the multiplication operation, as an operating circuit from the circuit group 12. For example, the operation instruction may include information on which circuits to use. Alternatively, the control circuit 11a may determine which circuits to use, on the basis of the operation instruction.

In addition, each time receiving an operation instruction, the control circuit 11a creates an operating status table 11d that indicates, in the circuit group 12, which circuits operate in accordance with the operation instruction as operating circuits and which circuits do not, on the basis of the operation instruction.

The control circuit 11a stores the created operating status table 11d in the storage unit 11c. In addition, the control circuit 11a retains history regarding the operating status table 11d created within the time period Δt before the current time, in the storage unit 11c, for example. In this connection, in place of previously created operating status tables 11d, the control circuit 11a may record the number of operating circuits corresponding to each previously received operation instruction in the storage unit 11c. For example, the control circuit 11a may retain history regarding the number of operating circuits detected within the time period Δt before the current time, in the storage unit 11c.

In addition, the control circuit 11a determines whether +x≥Nth is true, on the basis of the retained history regarding the operating status table 11d or the number of operating circuits and the current operating status table 11d. If +x≥Nth is true, the control circuit 11a sends a signal to instruct activation of ACC (lowering of the frequency of the clock signal CLK) to the ACC circuit 11b. If +x<Nth is true and the ACC is currently active, then the control circuit 11a sends a signal to instruct recovering (increasing) of the frequency of the clock signal CLK to the ACC circuit 11b.

The control circuit 11a is connected to the memory 14 and reads data to be supplied to the circuit group 12 from the memory 14 in accordance with an operation instruction. In addition, the control circuit 11a sends an instruction to cause the circuit group 12 to operate in accordance with the received operation instruction, as well as the data read from the memory 14, to the circuit group 12.

When receiving the signal for activating the ACC from the control circuit 11a, the ACC circuit 11b sends a control signal for lowering the frequency of the clock signal CLK to the clock generation circuit 13. When receiving the signal for recovering the frequency of the clock signal CLK from the control circuit 11a, the ACC circuit 11b sends a control signal for recovering the frequency of the clock signal CLK to the clock generation circuit 13.

In this connection, at shipping inspection of the information processing apparatus 10, for example, the frequency of the clock signal CLK that does not cause a timing error is detected in advance on the basis of a circuit delay that is due to power supply noise caused in the circuit group 12. For example, in activating the ACC, the ACC circuit 11b lowers the frequency of the clock signal CLK to the detected frequency.

The storage unit 11c stores the operating status table 11d. The storage unit 11c may store history regarding the number of operating circuits. The storage unit 11c is random access memory (RAM) or another memory, for example.

In the case where the information processing apparatus 10 is a processor with a plurality of processor cores (hereinafter, referred to as cores, simply), the above-described control unit 11 functions as a master core that controls the other cores. In this connection, each core functions as a single processor. In addition, the control unit 11 may be implemented by using an application-specific integrated circuit (ASIC), a field programmable gate array (FPGA), or another application-specific electronic circuit.

The circuit group 12 operates according to instructions and data received from the control unit 11, in synchronization with the clock signal CLK supplied from the clock generation circuit 13. In addition, the circuit group 12 is supplied with a power supply voltage VDD.

For example, the circuit group 12 includes computing units such as an adder and a multiplexer, and RAM. Especially, in the case of processors, such computing units are likely to cause power supply noise.

The clock generation circuit 13 generates the clock signal CLK, and changes the frequency of the clock signal CLK in response to a control signal received from the control unit 11. The clock generation circuit 13 is a phase locked loop (PLL) circuit, a delay locked loop (DLL) circuit, or another, for example. In the following description, it is assumed that the clock generation circuit 13 is a PLL circuit. The PLL circuit outputs the clock signal CLK whose frequency is an integral multiple of the frequency of a reference clock signal CLKR. The clock generation circuit 13 changes the frequency of the clock signal CLK by changing a division ratio set in a divider provided in the PLL circuit according to the control signal received from the control unit 11.

The memory 14 is non-volatile memory, such as flash memory, for example. The memory 14 stores therein data to be used in execution of operation instructions, control programs to be executed by the control unit 11, and others.

In the example of FIG. 1, the clock generation circuit 13 changes the frequency of the clock signal CLK according to a control signal output from the ACC circuit 11b. However, another configuration may be employed. The ACC circuit 11b may receive the clock signal CLK output from the clock generation circuit 13 and then change its frequency.

The following describes an example of a control method of the first embodiment (hereinafter, may be referred to as ACC drive control of the first embodiment) that is executed by the control unit 11 reading a control program from the memory 14 and running the control program.

Figure 2:
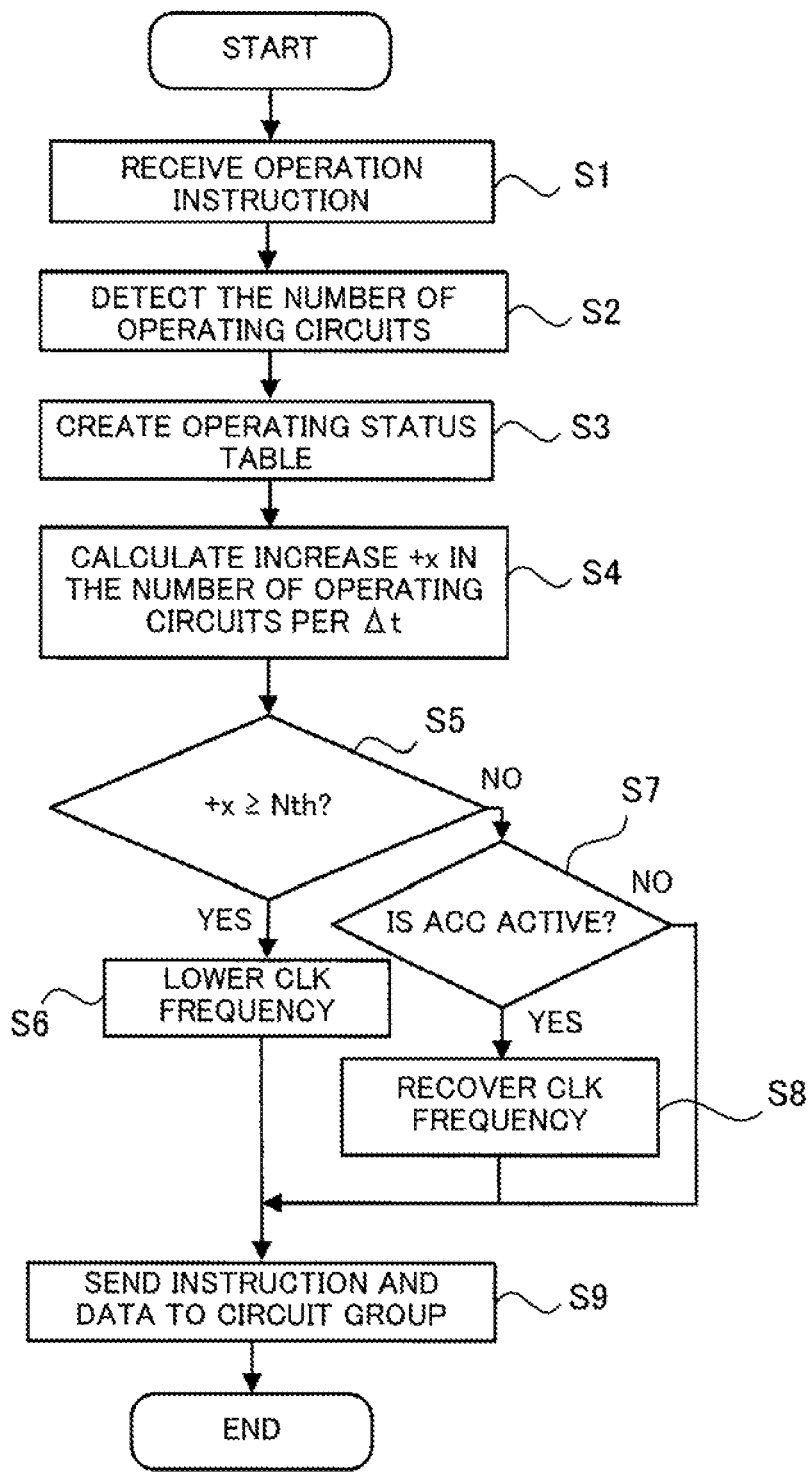
FIG. 2 is a flowchart illustrating an example of how to perform ACC drive control according to the first embodiment.

FIG. 2 is a flowchart illustrating an example of how to perform the ACC drive control according to the first embodiment.

For example, each time receiving an operation instruction via an input circuit, not illustrated, the control unit 11 performs the following process.

When receiving an operation instruction (step S1), the control unit 11 detects the number of operating circuits that are to operate in accordance with the operation instruction, in the circuit group 12 (step S2) and then creates an operating status table 11d (step S3). In this connection, the created operating status table 11d is stored in the storage unit 11c.

FIG. 1 illustrates, as examples of the operating status table 11d, an operating status table 11d1 created on receipt of an operation instruction A and an operating status table 11d2 created on receipt of an operation instruction B Δt after the receipt of the operation instruction A. In the example of FIG. 1, there are n cores with core numbers 1 to n and each core includes m circuits with circuit numbers 1 to m. The operating status tables 11d1 and 11d2 each indicate whether each of the n×m circuits is to operate. The operating status tables 11d1 and 11d2 have a value "on" to indicate that a corresponding circuit is to operate and a value "off" to indicate that a corresponding circuit is not to operate.

After step S3, the control unit 11 calculates an increase +x on the basis of retained history regarding the operating status table 11d and the currently created operating status table 11d (in this case, the operating status table 11d2, for example) (step S4). Then, the control unit 11 determines whether +x≥Nth is true (step S5).

If +x≥Nth is true, the control unit 11 causes the clock generation circuit 13 to lower the frequency of the clock signal CLK (step S6).

For example, if the operating status table 11d2 indicates the increase +x in the number of operating circuits from the operating status table 11d1 and +x≥Nth is true, the ACC by the ACC circuit 11b is activated. Thereby, the frequency of the clock signal CLK to be output from the clock generation circuit 13 is lowered.

If +x<Nth is true, the control unit 11 then determines whether the ACC is currently active (step S7). If the ACC is active, the control unit 11 causes the clock generation circuit 13 to recover the frequency of the clock signal CLK (step S8). Since there is a possibility that a sudden increase in the frequency of the clock signal CLK causes noise, the control unit 11 increases the frequency of the clock signal CLK stepwise, for example.

After step S6 or S8 is executed or if the ACC is determined not to be active in step S7, the control unit 11 sends an instruction to cause the circuit group 12 to operate in accordance with the received operation instruction, as well as data, to the circuit group 12 (step S9). In this connection, the data to be sent to the circuit group 12 is read from the memory 14. Then, the process that is performed when the control unit 11 receives one operation instruction is completed.

In this connection, there may be an operation instruction that causes the control unit 11 to receive data such as an operation result from a circuit of the circuit group 12 and to send the data to another circuit of the circuit group 12.

Before explaining advantages of the above-described ACC drive control of the first embodiment, ACC drive control that changes the frequency of a clock signal CLK using a power supply noise monitor will now be described as a comparative example.

Comparative Example

Figure 3:
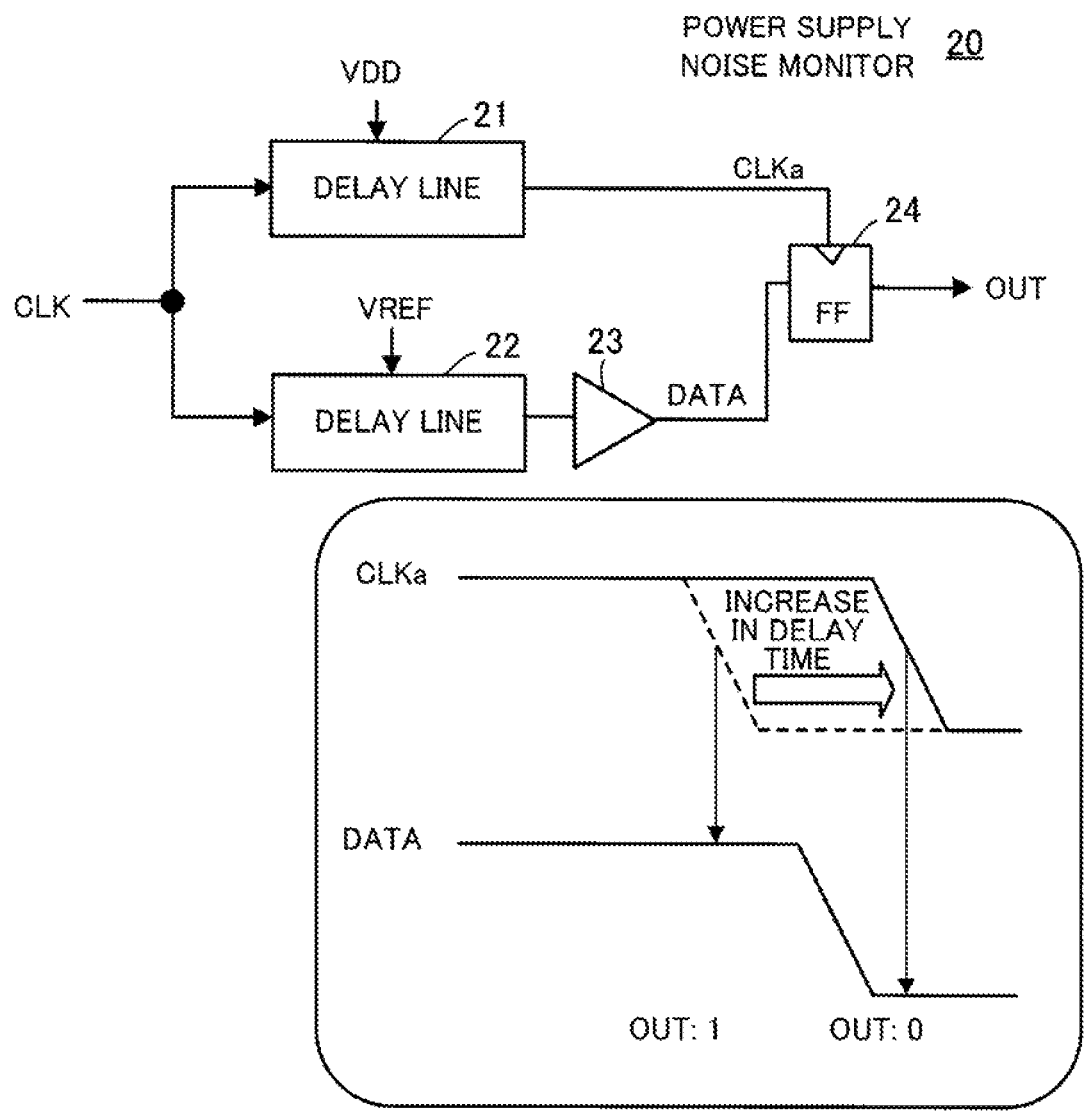
FIG. 3 illustrates an example of a power supply noise monitor that detects power supply noise.

FIG. 3 illustrates an example of a power supply noise monitor that detects power supply noise.

The power supply noise monitor 20 includes delay lines 21 and 22, a buffer 23, and a flip-flop (FF in FIG. 3) 24.

The delay lines 21 and 22 have a plurality of buffers connected in series, and are designed to delay a clock signal CLK by the same delay time. In this connection, a power supply voltage VDD is applied to the delay line 21, and a fixed reference voltage VREF that is not influenced by power supply noise is applied to the delay line 22. Therefore, if power supply noise occurs, the delay time in the delay line 21 becomes longer than that in the delay line 22.

The output terminal of the delay line 21 is connected to a clock input terminal of the flip-flop 24, whereas the output terminal of the delay line 22 is connected to a data input terminal of the flip-flop 24 via the buffer 23.

In this power supply noise monitor 20, the falling timing of a clock signal CLKa that is an output of the delay line 21 is earlier than the falling timing of a data signal DATA that is an output of the buffer 23 while power supply noise does not occur. Therefore, when the flip-flop 24 takes in the data signal DATA at the falling timing of the clock signal CLKa, the flip-flop 24 outputs an output signal OUT with a value of 1.

On the other hand, in the case where power supply noise occurs and the delay time in the delay line 21 increases, the falling timing of the clock signal CLKa may become later than the falling timing of the data signal DATA. In this case, the flip-flop 24 outputs an output signal OUT with a value of 0.

In ACC drive control using the above power supply noise monitor 20, the output signal OUT with a value of 0 is interpreted to mean that power supply noise that is likely to cause a timing error has occurred, which triggers lowering the frequency of the clock signal CLK.

Figure 4:
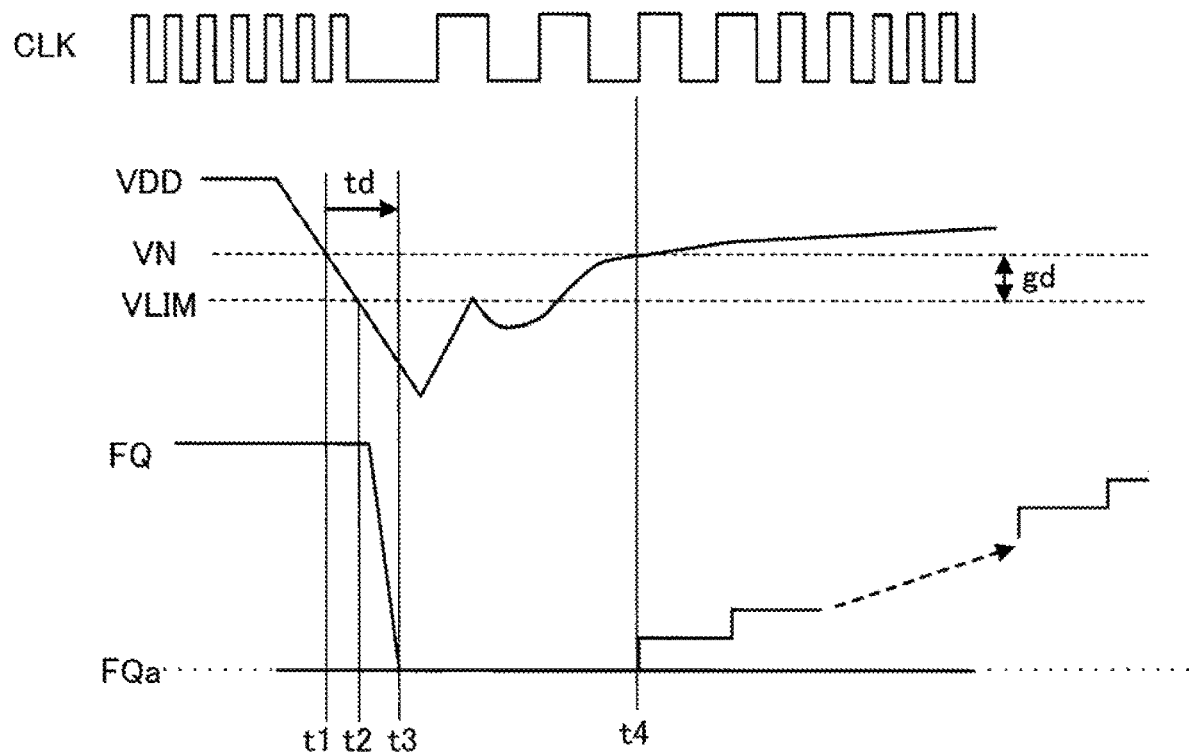
FIG. 4 is a waveform diagram illustrating an example of ACC drive control using the power supply noise monitor.

FIG. 4 is a waveform diagram illustrating an example of ACC drive control using the power supply noise monitor.

FIG. 4 exemplifies changes over time in a clock signal CLK, power supply voltage VDD, and the frequency FQ of the clock signal CLK.

A voltage VLIM is a lower-limit power supply voltage VDD that does not cause a timing error in the circuit group 12 illustrated in FIG. 1, for example. When the power supply voltage VDD drops below the voltage VLIM, a timing error occurs.

A voltage VN is a power supply voltage VDD with which the power supply noise monitor 20 outputs an output signal OUT with a value of 0. The voltage VN is set to be higher than the voltage VLIM by a prescribed voltage gd (hereinafter, referred to as a guard band gd). The voltage VN is set as a threshold for detecting occurrence of power supply noise.

Referring to the example of FIG. 4, the power supply voltage VDD drops to the voltage VN at timing t1 and then to the voltage VLIM at timing t2. Referring to the example of FIG. 4, the power supply voltage VDD drops below the voltage VLIM during a time period from timing t1 to timing t3 at which the frequency FQ of the clock signal CLK drops to a prescribed frequency FQa (this time period is a delay td of ACC activation), which means that a timing error occurs. A too small guard band gd probably causes such a problem.

In this connection, after the power supply voltage VDD is recovered and reaches the voltage VN at timing t4, the output signal OUT output from the power supply noise monitor 20 has a value of 1, and the frequency FQ of the clock signal CLK increases. In the example of FIG. 4, the frequency FQ increases stepwise.

Figure 5:
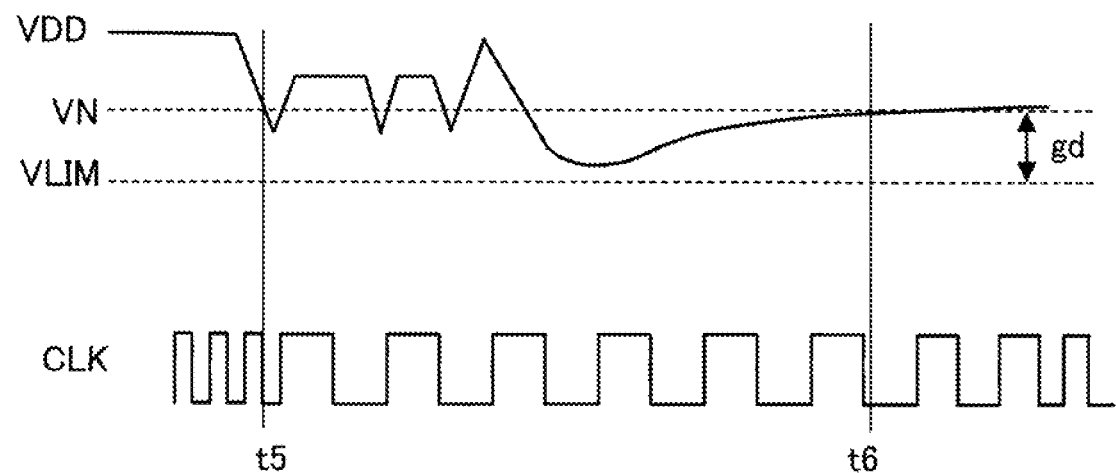
FIG. 5 is a waveform diagram illustrating another example of the ACC drive control using the power supply noise monitor.

FIG. 5 is a waveform diagram illustrating another example of the ACC drive control using the power supply noise monitor.

FIG. 5 exemplifies changes over time in power supply voltage VDD and a clock signal CLK.

In the case where the guard band gd is too large, the ACC is activated even when relatively small power supply noise (for example, this occurs during execution of a program with low computational load) or low-frequency noise, which is unlikely to cause a timing error, occurs, so as to lower the frequency of the clock signal CLK. FIG. 5 illustrates an example where the ACC is active from timing t5 at which the power supply voltage VDD drops to the voltage VN to timing t6. In the case where the guard band gd is too large, as illustrated, the clock frequency is lowered too often, and this may lengthen the time needed to complete an operation process in the circuit group 12.

Figure 6:
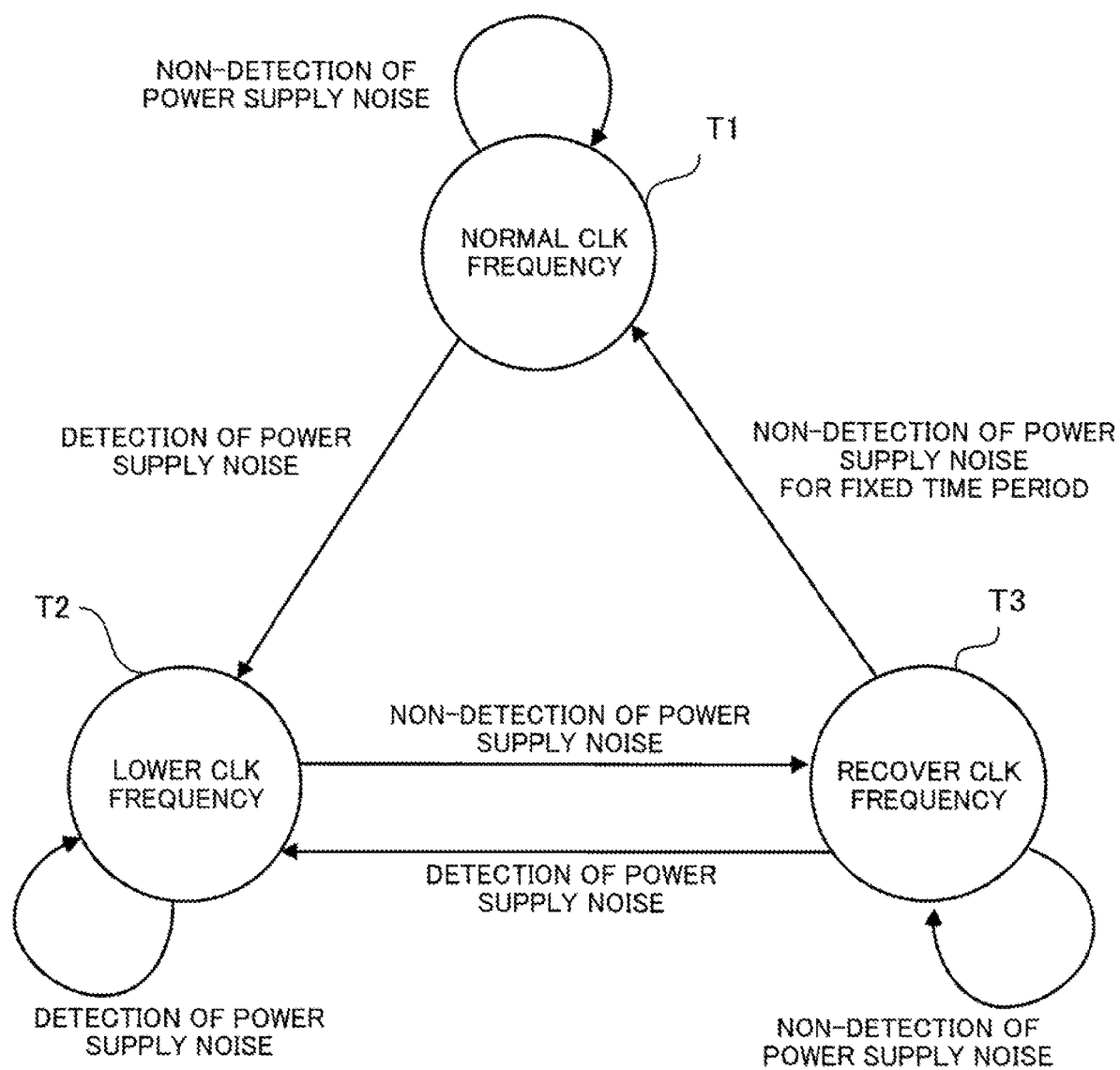
FIG. 6 is a state transition diagram in the ACC drive control based on power supply noise.

FIG. 6 is a state transition diagram in the ACC drive control based on power supply noise.

A state T1 is that the frequency of a clock signal CLK is normal. While no power supply noise is detected (while an output signal OUTPUT has a value of 1, in the case of using the power supply noise monitor 20 of FIG. 3), the state T1 remains. When a power supply noise is detected in the state T1 (when the output signal OUT has a value of 0, in the case of using the power supply noise monitor 20 of FIG. 3), the state T1 transitions to a state T2.

The state T2 is that the frequency of the clock signal CLK is lowered. While the power supply noise is detected in the state T2, the state T2 remains. When the power supply noise is no longer detected, the state T2 transitions to a state T3.

The state T3 is that the frequency of the clock signal CLK is recovered (increased). When a power supply noise is detected in the state T3, the state T3 transitions to the state T2. While no power supply noise is detected, the state T3 remains, and then after no power supply noise is detected for a fixed time period, the state T3 transitions to the state T1.

Figure 7:
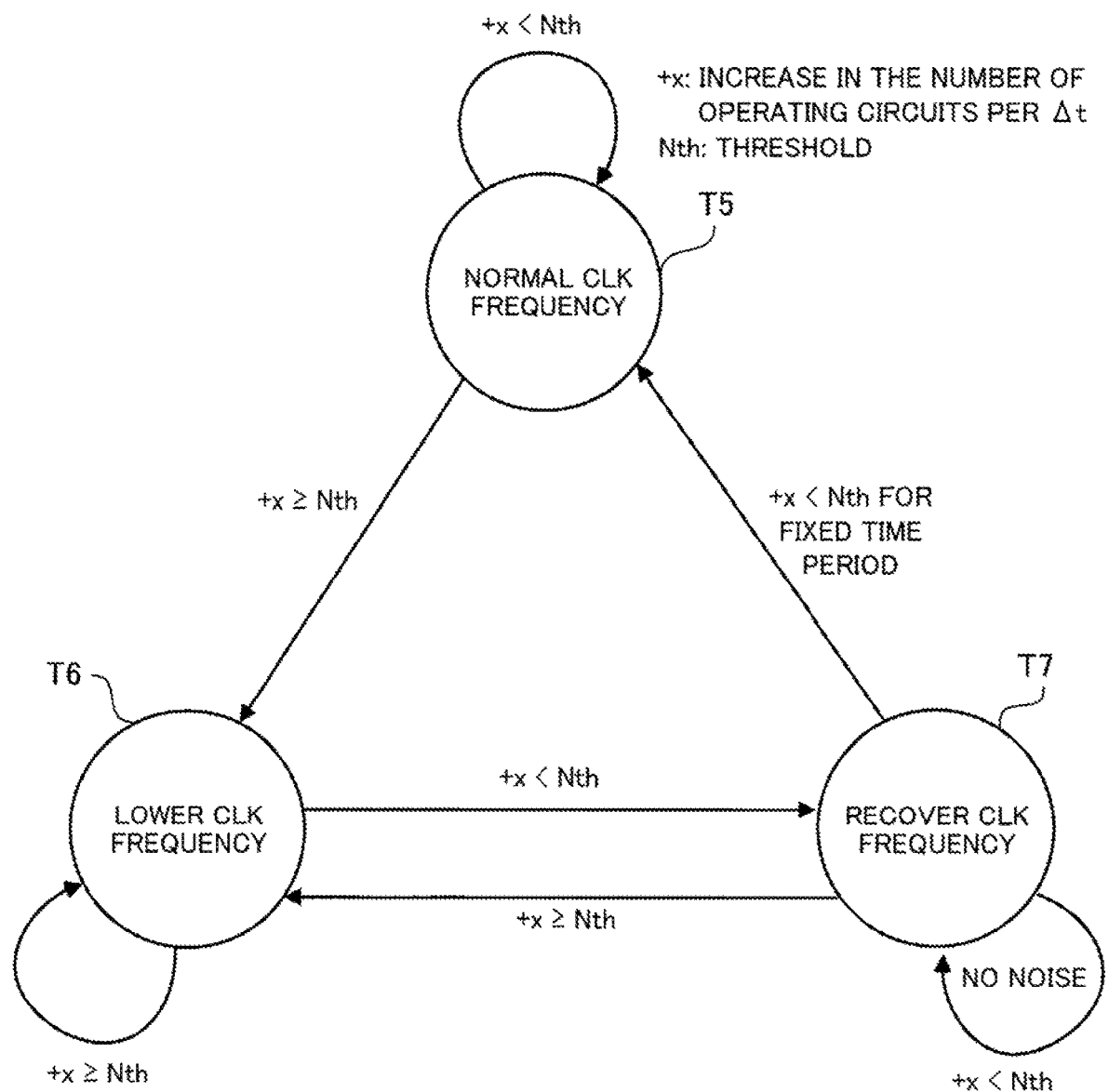
FIG. 7 is a state transition diagram in ACC drive control according to the first embodiment.

FIG. 7 is a state transition diagram in the ACC drive control according to the first embodiment.

A state T5 is that the frequency of a clock signal CLK is normal. While an increase +x in the number of operating circuits per Δt is smaller than a threshold Nth, the state T5 remains. When +x≥Nth becomes true in the state T5, the state T5 transitions to a state T6.

The state T6 is that the frequency of the clock signal CLK is lowered. While +x≥Nth is true in the state T6, the state T6 remains. When +x<Nth becomes true in the state T6, the state T6 transitions to a state T7.

The state T7 is that the frequency of the clock signal CLK is recovered (increased). When +x≥Nth becomes true in the state T7, the state T7 transitions to the state T6. While +x<Nth is true in the state T7, the state T7 remains, and then after +x<Nth remains for a fixed time period, the state T7 transitions to the state T5.

Figure 8:
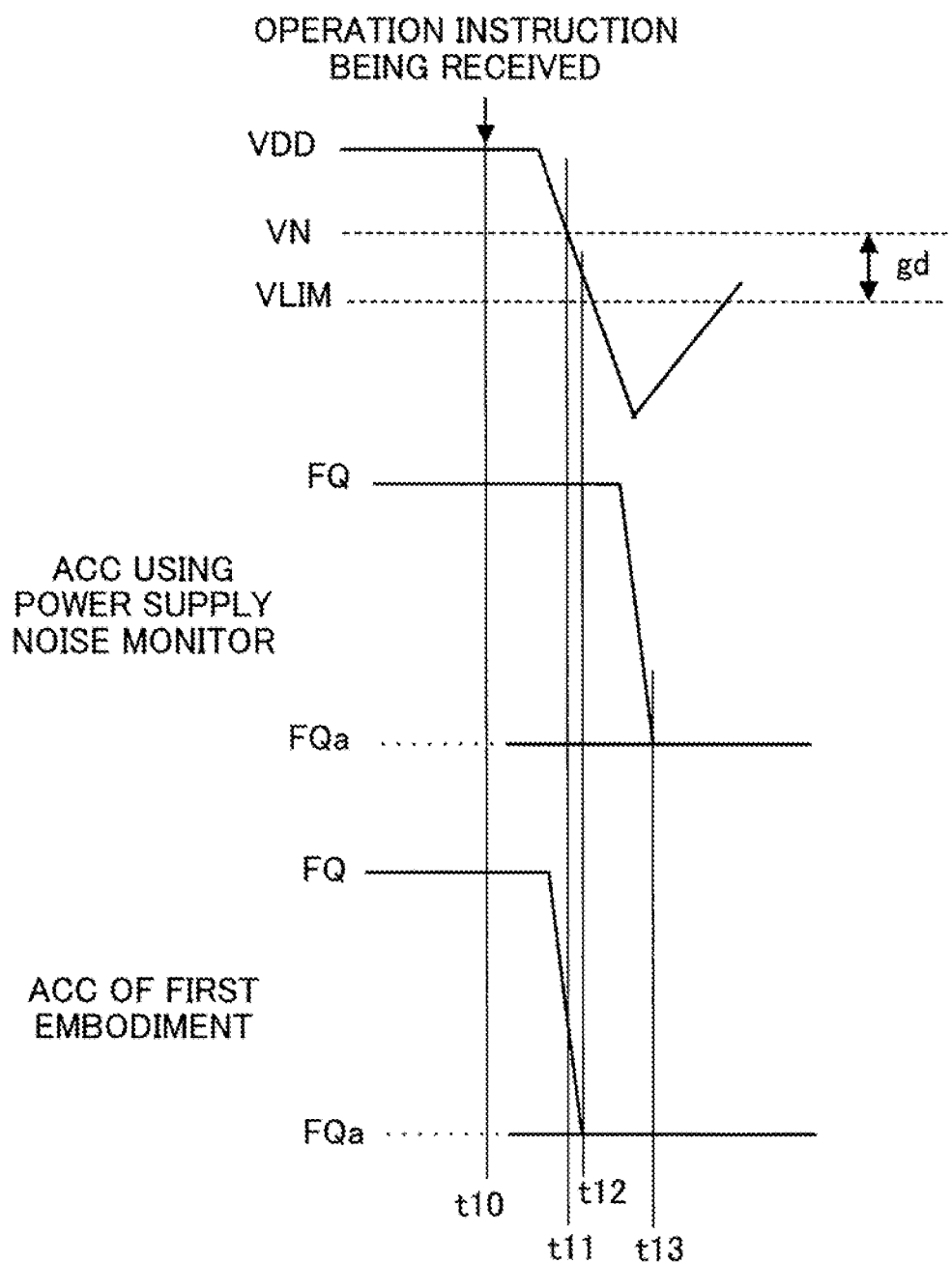
FIG. 8 is a waveform diagram illustrating an example of the ACC drive control according to the first embodiment.

FIG. 8 is a waveform diagram illustrating an example of the ACC drive control according to the first embodiment.

FIG. 8 exemplifies changes over time in power supply voltage VDD and the frequency FQ of a clock signal CLK. FIG. 8 also exemplifies, for comparison, changes over time in the frequency FQ of a clock signal CLK in the ACC drive control using the power supply noise monitor 20.

The ACC drive control of the first embodiment is that, when the control unit 11 receives an operation instruction (timing t10) and +x≥Nth is true, an ACC process starts before the operation instruction is executed. On the other hand, the ACC drive control using the power supply noise monitor 20 is that, when a power supply voltage VDD drops to a voltage VN (timing t11), the ACC process starts.

Although the ACC drive control of the first embodiment may have an activation delay, the ACC process starts before the operation instruction is executed. Therefore, referring to the example of FIG. 8, the frequency FQ drops to a frequency FQa (timing t12) before the power supply voltage VDD drops to the voltage VLIM.

On the other hand, referring to the example of FIG. 8, in the ACC drive control using the power supply noise monitor 20, the frequency FQ drops to the frequency FQa (timing t13) after the power supply voltage VDD drops below the voltage VLIM, due to an activation delay. Therefore, there is a possibility that a timing error occurs.

Figure 9:
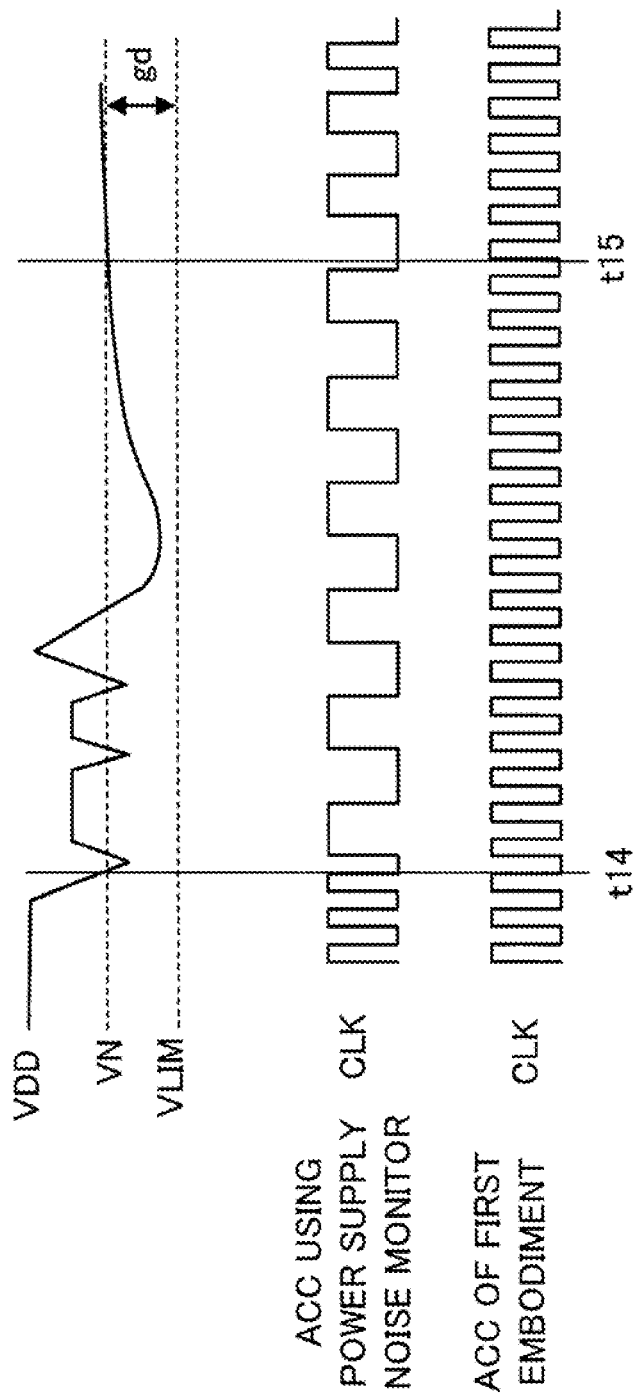
FIG. 9 is a waveform diagram illustrating another example of the ACC drive control according to the first embodiment.

FIG. 9 is a waveform diagram illustrating another example of the ACC drive control according to the first embodiment.

FIG. 9 exemplifies changes over time in power supply voltage VDD and a clock signal CLK. FIG. 9 also exemplifies, for comparison, changes over time in a clock signal CLK in the ACC drive control using the power supply noise monitor 20.

As described earlier, in the case where a guard band gd is too large in the ACC drive control using the power supply noise monitor 20, the ACC is activated even when relatively small power supply noise or low-frequency noise, which is unlikely to cause a timing error, occurs, so that the frequency of the clock signal CLK is lowered. FIG. 9 illustrates an example where the ACC is active during a time period from timing t14 when the power supply voltage VDD drops to the voltage VN to timing t15.

On the other hand, in the ACC drive control of the first embodiment, while +x<Nth is true, the ACC is not activated. Therefore, too many activations of the ACC, like the case of the ACC activation using the power supply noise monitor 20, are prevented. This in turn prevents too long execution of an operation process in the circuit group 12.

As described above, in the ACC drive control of the first embodiment, it is determined based on a comparison between an increase +x and the threshold Nth whether power supply noise that is likely to cause a timing error will occur, and if it is determined that such power supply noise will occur, the frequency of the clock signal CLK is lowered. By doing so, too many activations of the ACC are prevented, and the occurrence of timing errors due to power supply noise is suppressed without increasing the number of times the clock frequency is lowered.

In addition, the ACC drive control of the first embodiment is implemented by using logic circuits, and therefore is preferable for ASIC circuits.

Second Embodiment

Figure 10:
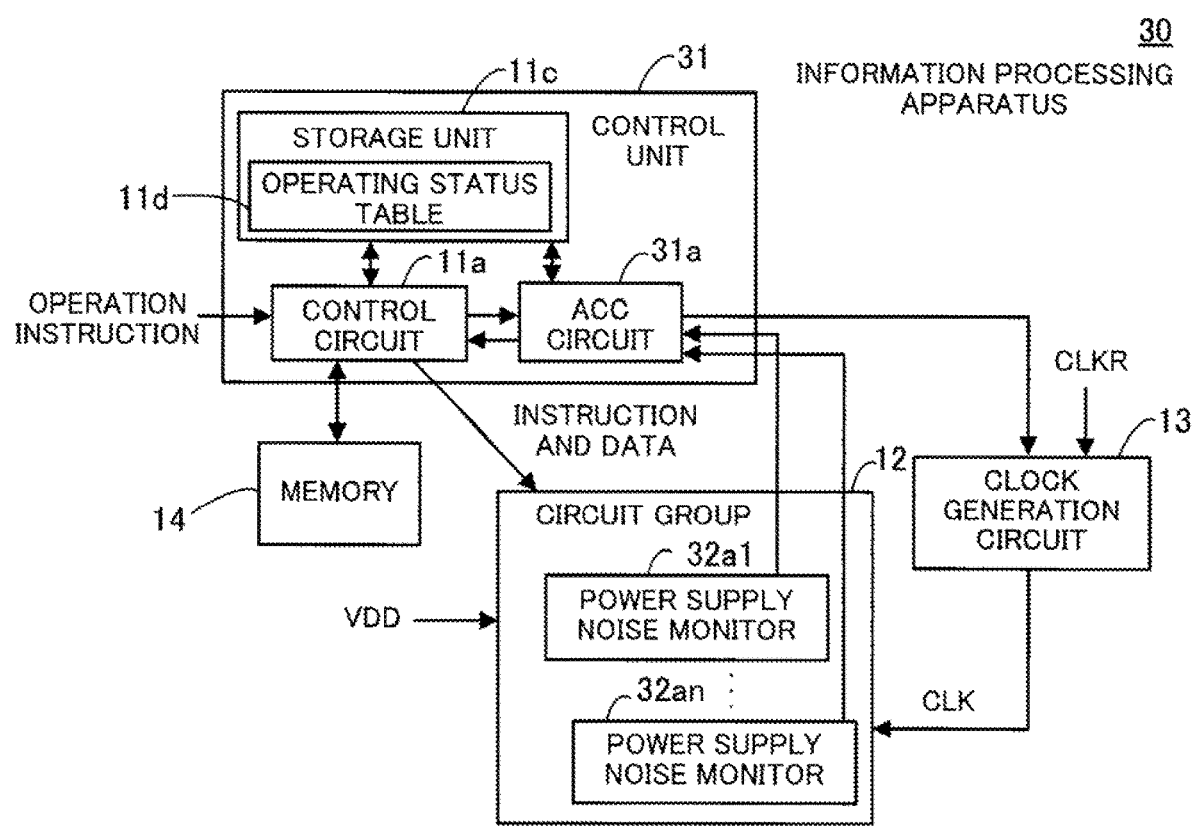
FIG. 10 illustrates an example of an information processing apparatus according to a second embodiment.

FIG. 10 illustrates an example of an information processing apparatus according to the second embodiment. In FIG. 10, the same reference numerals as used for the information processing apparatus 10 according to the first embodiment in FIG. 1 are applied to corresponding elements.

In the information processing apparatus 30 of the second embodiment, an ACC circuit 31a of a control unit 31 calculates a threshold Nth on the basis of results of measuring a noise amount, obtained by a plurality of power supply noise monitors 32a1 to 32an provided in a circuit group 12, during shipping inspection or another occasion, for example.

The power supply noise monitors 32a1 to 32an may be voltage sensors that directly detect a drop in power supply voltage or may be delay measurement circuits that measure a signal delay due to a drop in power supply voltage. The power supply noise monitors 32a1 to 32an output a noise amount or a value equivalent to the noise amount.

Figure 11:
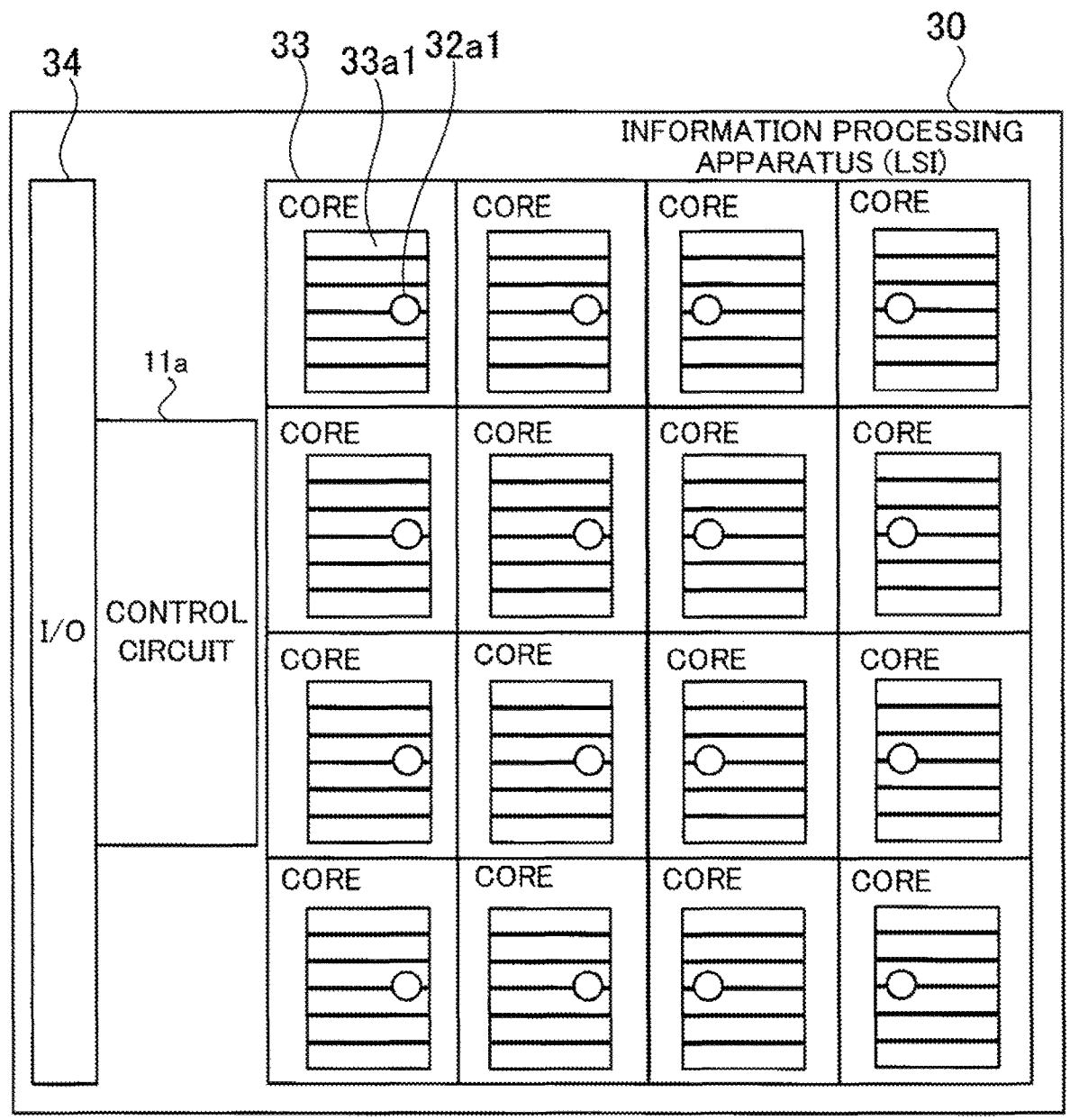
FIG. 11 illustrates an example of deployment of power supply noise monitors.

FIG. 11 illustrates an example of deployment of power supply noise monitors.

FIG. 11 illustrates an example where the information processing apparatus 30 is an LSI and the circuit group 12 illustrated in FIG. 10 includes 6×16 computing units. In the example of FIG. 11, 16 cores (for example, a core 33) each include six computing units (for example, a computing unit 33a1). In this connection, in FIG. 11, in addition to a control circuit 11a, an input-output circuit (I/O) 34 is illustrated. In FIG. 11, the storage unit 11c, clock generation circuit 13, memory 14, and ACC circuit 31a illustrated in FIG. 10 are not illustrated.

In the example of FIG. 11, one power supply noise monitor (for example, the power supply noise monitor 32a1) is provided in each core.

The following describes an example of a pre-learning process for the threshold Nth by the ACC circuit 31a.

Figure 12:
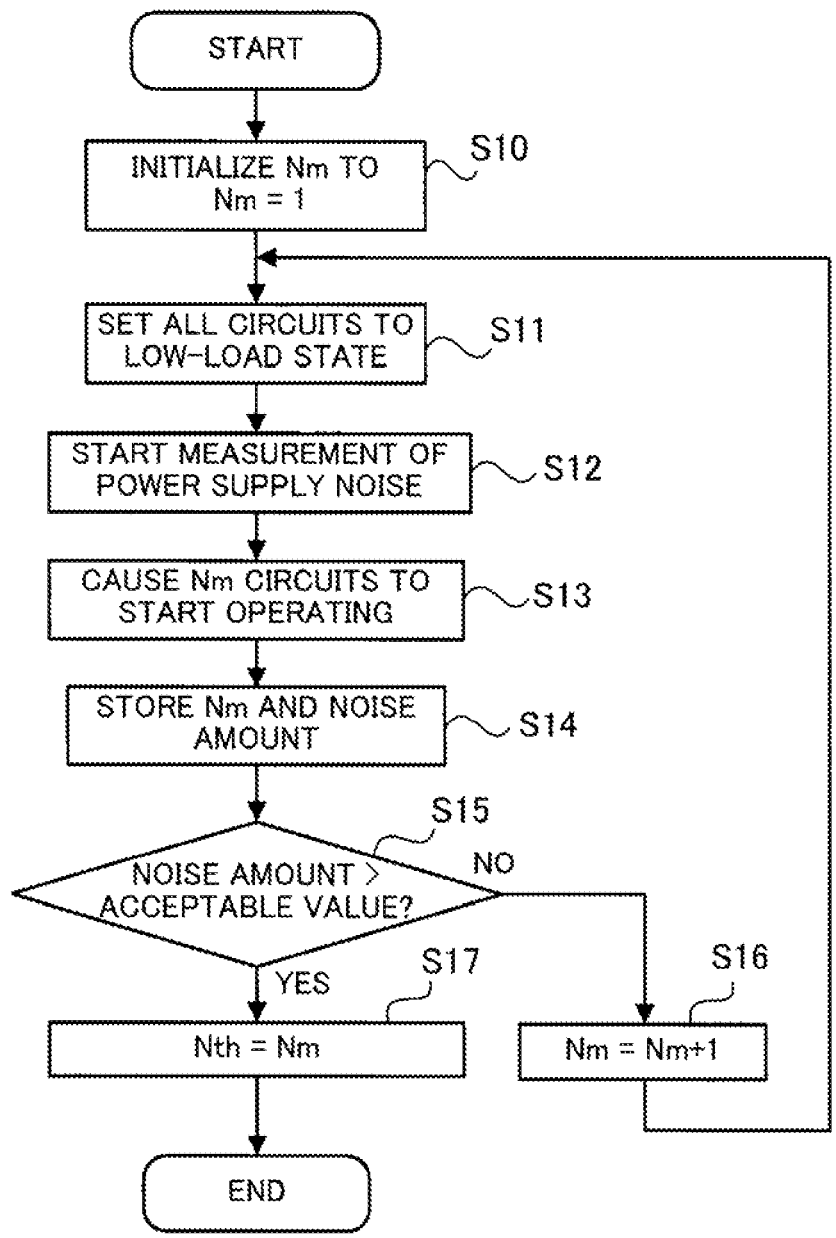
FIG. 12 is a flowchart illustrating a pre-learning process for a threshold Nth.

FIG. 12 is a flowchart illustrating the pre-learning process for the threshold Nth.

First, the ACC circuit 31a initializes Nm indicating the number of circuits that are to operate simultaneously, to one (step S10). Then, the ACC circuit 31a sets the entire circuit group 12 (all circuits) to a low-load state (non-operating state) (step S11). For example, the ACC circuit 31a causes the clock generation circuit 13 to stop supply of a clock signal CLK to all the circuits.

After that, the ACC circuit 31a causes the power supply noise monitors 32a1 to 32an to start measurement of power supply noise (step S12) and causes Nm circuits to start operating (step S13). For example, the ACC circuit 31a causes the clock generation circuit 13 to start the supply of the clock signal CLK to the Nm circuits.

Then, the ACC circuit 31a stores the Nm value and the measured noise amount (for example, the maximum drop amount of the power supply voltage VDD) in the storage unit 11c (step S14), for example, and determines whether the noise amount exceeds an acceptable value (step S15). In this connection, the noise amount stored is the maximum noise amount among the noise amounts measured by the power supply noise monitors 32a1 to 32an. The acceptable value is an upper-limit noise amount that does not cause a timing error. If the noise amount exceeds the acceptable value, this means that a timing error probably occurs.

In the case where the noise amount does not exceed the acceptable value, the ACC circuit 31a increments Nm by one (step S16) and returns back to step S11 to repeat the process.

Figure 13:
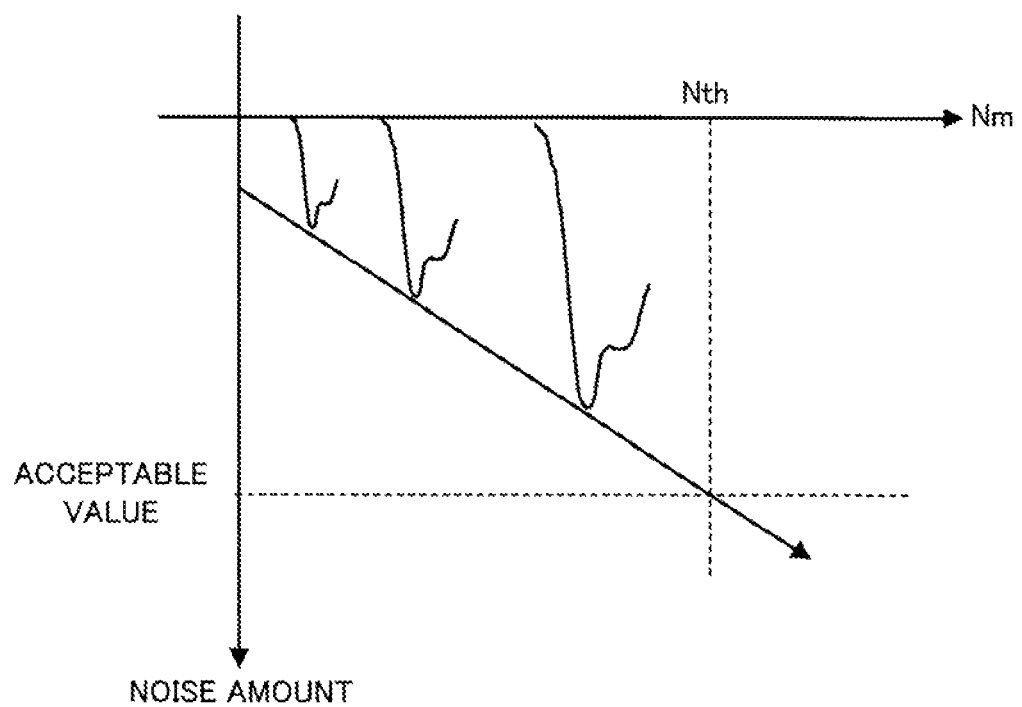
FIG. 13 illustrates an example of relationship between Nm and noise amount.

FIG. 13 illustrates an example of relationship between Nm and noise amount. In FIG. 13, the horizontal axis represents Nm, whereas the vertical axis represents noise amount.

The noise amount increases as Nm increases. FIG. 13 illustrates an example where the noise amount increases proportionally with an increase in Nm.

The ACC circuit 31a detects Nm at the time when the noise amount exceeds the acceptable value, and sets the detected Nm as the above-described threshold Nth (step S17). Then, the ACC circuit 31a completes the pre-learning process. The ACC circuit 31a may send the determined threshold Nth to the control circuit 11a or may store it in the storage unit 11c.

In addition, the process of FIG. 12 may be performed by the control circuit 11a, in place of the ACC circuit 31a.

To determine the threshold Nth with the above-described pre-learning process leads to suppressing deterioration in the accuracy of ACC drive control due to variations in the relationship between an operation instruction and noise amount, which are caused due to manufacturing variations of the information processing apparatus 30.

In this connection, the relationship between Nm and noise amount, stored in the storage unit 11c in the above-described step S14 of FIG. 12, is used, for example, for determining the magnitude of the power supply voltage VDD, for detecting defective chips, or for another purpose during shipping inspection.

In addition, the ACC circuit 31a may obtain the propagation characteristics of power supply noise with a pre-learning process.

Figure 14:
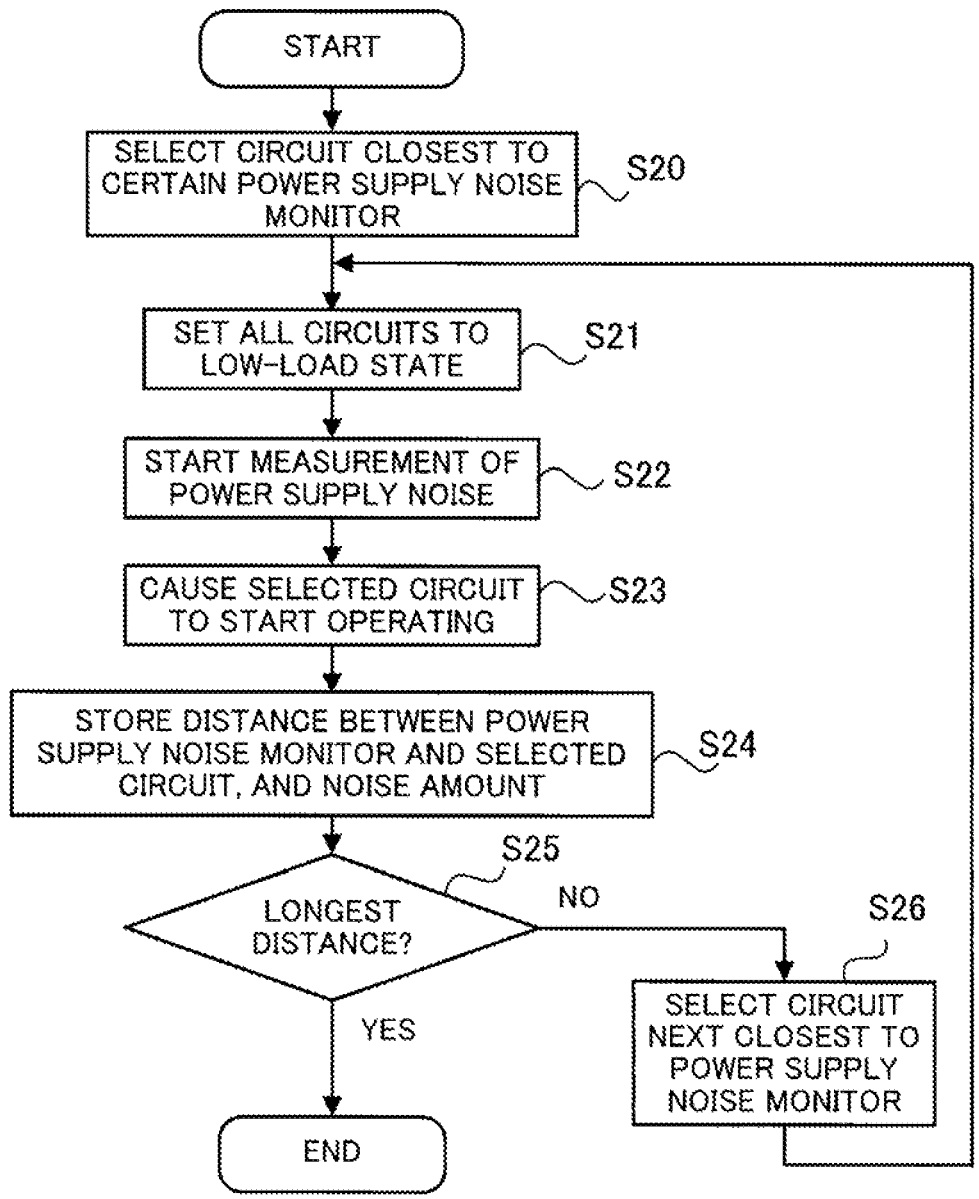
FIG. 14 is a flowchart illustrating an example of a pre-learning process of obtaining the propagation characteristics of power supply noise.

FIG. 14 is a flowchart illustrating an example of the pre-learning process of obtaining the propagation characteristics of power supply noise.

First, the ACC circuit 31a selects, from the circuit group 12, a circuit closest to one (hereinafter, power supply noise monitor 32a1) of the power supply noise monitors 32a1 to 32an (step S20). Then, the ACC circuit 31a sets the entire circuit group 12 (all circuits) to a low-load state (non-operating state) (step S21). For example, the ACC circuit 31a causes the clock generation circuit 13 to stop supply of a clock signal CLK to all the circuits.

After that, the ACC circuit 31a causes the power supply noise monitor 32a1 to start measurement of power supply noise (step S22) and causes the selected circuit to start operating (step S23). For example, the ACC circuit 31a causes the clock generation circuit 13 to start the supply of the clock signal CLK to the selected circuit.

Then, the ACC circuit 31a stores the distance between the power supply noise monitor 32a1 and the selected circuit and the noise amount measured by the power supply noise monitor 32a1, in the storage unit 11c (step S24), for example. After that, the ACC circuit 31a determines whether the selected circuit has the longest distance to the power supply noise monitor 32a1 (step S25). If the selected circuit does not have the longest distance to the power supply noise monitor 32a1, the ACC circuit 31a selects a circuit next closest to the power supply noise monitor 32a1 (step S26), and returns back to step S21 to repeat the process.

When it is determined that the selected circuit has the longest distance to the power supply noise monitor 32a1, the ACC circuit 31a completes the process.

Figure 15:
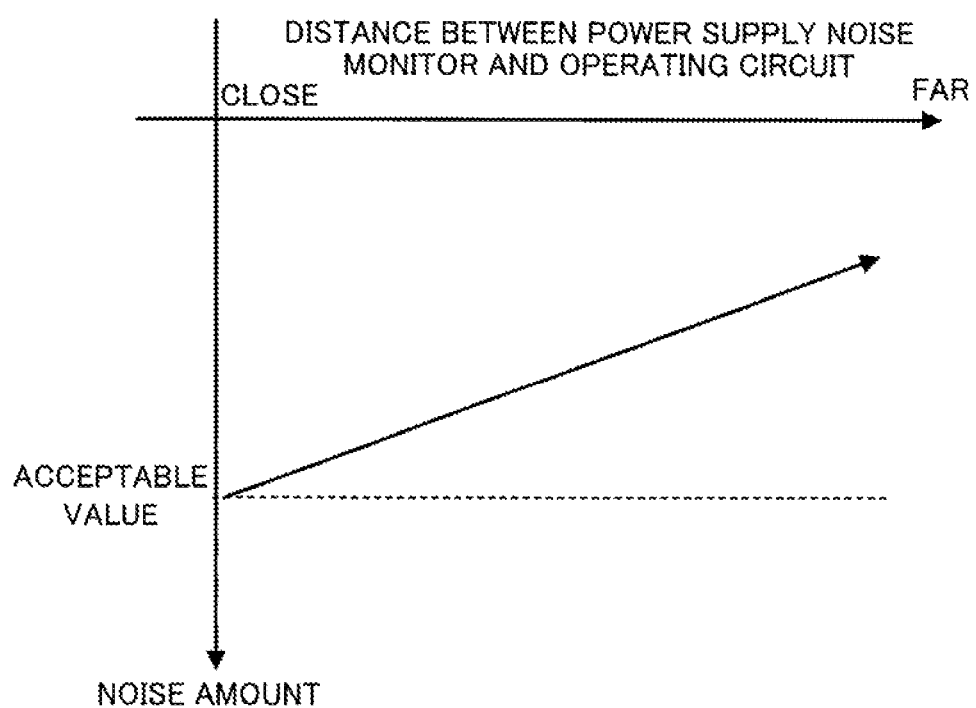
FIG. 15 illustrates relationship between the distance between a power supply noise monitor and an operating circuit and noise amount.

FIG. 15 illustrates relationship between the distance between a power supply noise monitor and an operating circuit and noise amount. In FIG. 15, the horizontal axis represents the distance between a power supply noise monitor and an operating circuit, whereas the vertical axis represents noise amount. The noise amount decreases as the distance between a power supply noise monitor and an operating circuit gets longer.

In this connection, the process of FIG. 14 may be performed by the control circuit 11a, in place of the ACC circuit 31a.

The relationship between the distance between the power supply noise monitor 32a1 and a selected circuit and the noise amount measured by the power supply noise monitor 32a1, stored in the storage unit 11c in the above step S24, is used by the control circuit 11a to determine operation timing of the circuit group 12, for example.

Figure 16:
FIG. 16 illustrates an example of operation timing of a circuit group.

FIG. 16 illustrates an example of operation timing of a circuit group.

In "Case 1," all 16 cores are switched from the non-operating state ("idle") to the operating state ("run") simultaneously at certain timing. In this case, there is a possibility that large power supply noise Occurs. Therefore, the control circuit 11a causes the circuit group 12 to reduce the number of cores that are to operate, as in "Case 2" or to start to operate cores one by one stepwise, as in "Case 3."

The control circuit 11a controls circuits located close to each other, which are highly influenced by each other's power supply noise, so as not to operate simultaneously, on the basis of the operating status tables 11d of FIG. 1 and the above-described relationship between distance and noise amount, for example.

By the way, the processing content of the ACC drive control according to the above-described first and second embodiments is implemented by causing the information processing apparatuses 10 and 30 to execute a control program.

The control program may be recorded on a computer-readable recording medium. Examples of such recording media include magnetic disks, optical discs, magneto-optical discs, and semiconductor memory devices. The magnetic disks include flexible disks (FDs) and hard disk drives (HDDs). Optical discs include compact discs (CDs), compact discs-recordable (CD-Rs), compact discs-rewritable (CD-RWs), digital versatile discs (DVDs), DVD-Rs, and DVD-RWs. The program may be recorded on portable recording media, which are then distributed. In this case, the program may be copied from a portable recording medium to another recording medium and then executed.

Heretofore, one aspect of the control program, information processing apparatus, and control method has been described in the above embodiments, but these are just examples and are not limited to the above-described configuration.

According to one aspect, occurrence of timing errors due to power supply noise is suppressed without increasing the number of times a clock frequency is lowered.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-transitory computer-readable recording medium storing a computer program that causes a computer to perform a process comprising:
   receiving operation instructions;
   detecting, each time receiving one of the operation instructions, a number of operating circuits that are to operate in accordance with the received operation instruction, in a circuit group of circuits that operate in synchronization with a clock signal;
   determining, each time receiving the one of the operation instructions, whether an increase in the number of operating circuits per prescribed time period is greater than or equal to a threshold; and
   lowering a frequency of the clock signal upon determining that the increase in the number of operating circuits is greater than or equal to the threshold.

2. The non-transitory computer-readable recording medium according to claim 1, wherein the process further includes creating, each time receiving the one of the operation instructions, an operating status table indicating the operating circuits and circuits that are not to operate in the circuit group, based on the received operation instruction and storing the operating status table in a storage unit.

3. The non-transitory computer-readable recording medium according to claim 2, wherein the process further includes calculating the increase in the number of operating circuits per prescribed time period, based on history regarding the operating status table created within the prescribed time period.

4. The non-transitory computer-readable recording medium according to claim 1, wherein the process further includes calculating the threshold in advance, based on relationship between a number of circuits that operate simultaneously in the circuit group and a result of measuring a power supply noise.

5. An information processing apparatus, comprising:
a circuit group of circuits configured to operate in synchronization with a clock signal;
a clock generation circuit configured to generate the clock signal; and
a control unit configured to
receive operation instructions,
detect, each time receiving one of the operation instructions, a number of operating circuits that are to operate in accordance with the received operation instruction, in the circuit group,
determine, each time receiving the one of the operation instructions, whether an increase in the number of operating circuits per prescribed time period is greater than or equal to a threshold, and
cause the clock generation circuit to lower a frequency of the clock signal upon determining that the increase in the number of operating circuits is greater than or equal to the threshold.

6. A control method, comprising:
receiving, by a control unit, operation instructions;
detecting, by the control unit, each time receiving one of the operation instructions, a number of operating circuits that are to operate in accordance with the received operation instruction, in a circuit group of circuits that operate in synchronization with a clock signal;
determining, by the control unit, each time receiving the one of the operation instructions, whether an increase in the number of operating circuits per prescribed time period is greater than or equal to a threshold; and
lowering, by the control unit, a frequency of the clock signal upon determining that the increase in the number of operating circuits is greater than or equal to the threshold.

* * * * *